US008015523B2

(12) United States Patent
Baumgartner et al.

(10) Patent No.: US 8,015,523 B2
(45) Date of Patent: Sep. 6, 2011

(54) METHOD AND SYSTEM FOR SEQUENTIAL NETLIST REDUCTION THROUGH TRACE-CONTAINMENT

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 12/392,278

(22) Filed: Feb. 25, 2009

(65) Prior Publication Data

US 2010/0218148 A1    Aug. 26, 2010

(51) Int. Cl.
*G06F 17/50* (2006.01)
*G06F 9/455* (2006.01)

(52) U.S. Cl. ........................ 716/107; 716/103

(58) Field of Classification Search .......... 716/103, 716/107
See application file for complete search history.

(56) References Cited

U.S. PATENT DOCUMENTS

| 6,567,959 B2 | 5/2003 | Levin et al. |
| 2006/0190873 A1 | 8/2006 | Baumgartner et al. |
| 2006/0248494 A1 | 11/2006 | Baumgartner et al. |

*Primary Examiner* — Stacy A Whitmore
(74) *Attorney, Agent, or Firm* — The Brevetto Law Group

(57) ABSTRACT

Methods and systems are provided for sequential netlist reduction through trace-containment for a circuitry design netlist by first identifying a cut of the netlist and enumerating a set of mismatch traces. Perform time-bounded unfolding of a cofactored version of the cut to reflect the sequential cofactor for a specific input i and temporal uncorrelation constraints for the set of inputs 'J'. Determine whether there is trace containment by performing equivalence checking with respect to the cut of the netlist under temporal uncorrelation constraints for the set of inputs 'J'. In response to detecting trace containment, simplify the netlist by merging the input 'i' to a constant.

16 Claims, 9 Drawing Sheets

```
mismatch_frontier = {input to eliminate} while(1)
    {
        if(resource limitation exceeded) break;

trace = Search_For_Mismatch(mismatch_frontier);
        if(trace)
            {
                Extend_Trace(trace);
                new_mismatch_frontier = Find_New_Frontier(mismatch_frontier, trace);
            }
            if(new_mismatch_frontier != mismatch_frontier)
            {
                mismatch_frontier = new_mismatch_frontier;
            }
        else break;
    }
```

FIG. 2C

Netlist N given positive sequential cofactor of i1.

Netlist N given negative sequential cofactor of i1.

Netlist N given positive sequential cofactor of i1.

Netlist N given negative sequential cofactor of i1.

METHOD AND SYSTEM FOR SEQUENTIAL NETLIST REDUCTION THROUGH TRACE-CONTAINMENT

BACKGROUND

1. Field of the Invention

The present invention relates to digital circuitry designs of state machines, and more specifically, to systems, methods and computer products for efficiency improvements in the digital circuitry designs.

2. Description of Related Art

An electrical circuit with memory elements may be modeled using state equations and state variables to describe the behavior and state of the system. A complete set of state variables for a system, coupled with logic that defines the transitions between states, typically contains enough information about the system's history to enable computation of the system's future behavior. Simplifying the model to reduce the number of state variables, or simplifying the logic that defines state transitions, lessens the computational cost of analyzing the model, for example, to verify that it conforms to a given specification.

The synthesis and verification of state variable models often requires a great deal of computational resources. Hence, the ability to reduce design size is of central importance to a variety of tasks in logic design since verification algorithms often require exponential resources with respect to design size. The ability to reduce design size may make the difference in whether or not it is feasible to use a verification algorithm to expose a design flaw.

What is needed is an automated method of reducing design size while preserving the behavior of the design with respect to verification results.

SUMMARY

Embodiments disclosed herein address the above stated needs by providing systems, methods and computer products that reduce design size through methods of trace-containment detection which preserve the behavior of the design with respect to verification results.

Various embodiments provide for a sequential netlist reduction through trace-containment for a circuitry design netlist by identifying a cut of the netlist, enumerating a set of mismatch traces, and then deriving a set of inputs 'J' from the mismatch traces for equivalence checking to detect trace containment. The various embodiments perform time-bounded unfolding of a cofactored version of the cut reflecting sequential cofactor for i and temporal uncorrelation constraints for the set of inputs 'J', and then determine whether there is trace containment. A constraining relation over the set of inputs 'J' may be recognized in response to detecting trace containment. Upon recognizing the constraining relation over the inputs 'J' the embodiments may seek to prove sequential equivalence of the cut.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings:

FIG. 2C depicts pseudo-code for obtaining a cut for use in trace-containment based reduction;

DETAILED DESCRIPTION

Various embodiments disclosed herein provide for automated reduction of sequential designs via trace-containment detection. This includes a number of interrelated aspects, including, for example, an overall framework for reducing netlist size through iteratively postulating a desired reduction, postulating a temporal relation among inputs of the design to enable effective trace-containment detection then attempting to prove the corresponding trace-containment to enable the reduction. A second, related aspect involves computing a cut of a netlist against which to obtain mismatch traces which may be used to enable efficient trace-containment detection. In a third related aspect a temporal relation is determined between inputs that may be used to enable efficient trace-containment detection. Finally, a fourth related aspect concerns a mechanism to implement the determined temporal relation between the input that we wish to eliminate and other inputs to enable efficient trace-equivalence detection. While some of the various aspects may, in some situations, be implemented as standalone solutions, it is useful to provide an overall verification framework in accordance with the disclosed embodiments.

A netlist for a circuit design contains a directed graph with vertices representing gates, and edges representing interconnections between those gates. The gates have associated functions such as constants, primary inputs, combinational logic such as AND gates, and sequential elements (hereafter referred to as registers). Registers have two types of associated functions: their next-state functions, and their initial-value functions. Both are represented as other gates in the graph. Semantically, for a given register, the value appearing at its initial-value gate at time "0" ("initialization" or "reset" time) will be applied as the value of the register itself. The value appearing at its next-state function gate at time 'i' will be applied to the register itself at time 'i+1'. A netlist with no registers is called "combinational". Certain gates in a netlist may be labeled as targets. Targets correlate to the properties sought to be verified. The goal of the verification process is to find a way to drive a "1" to a target node (and to generate a "trace" of valuations to gates over time illustrating this scenario if one is found), or else to prove that no such assertion of the target is possible. The term "cofactor" refers to replacing an input in a design by a constant. A positive cofactor refers to replacing the input by constant 1. A negative cofactor refers to replacing the input by constant 0. A netlist may be simplified by the "merge" operation which replaces fanout references from one gate with references to the gate that it is being merged onto. A "cut" refers to a partitioning of a netlist graph into two components.

Figure 1A:
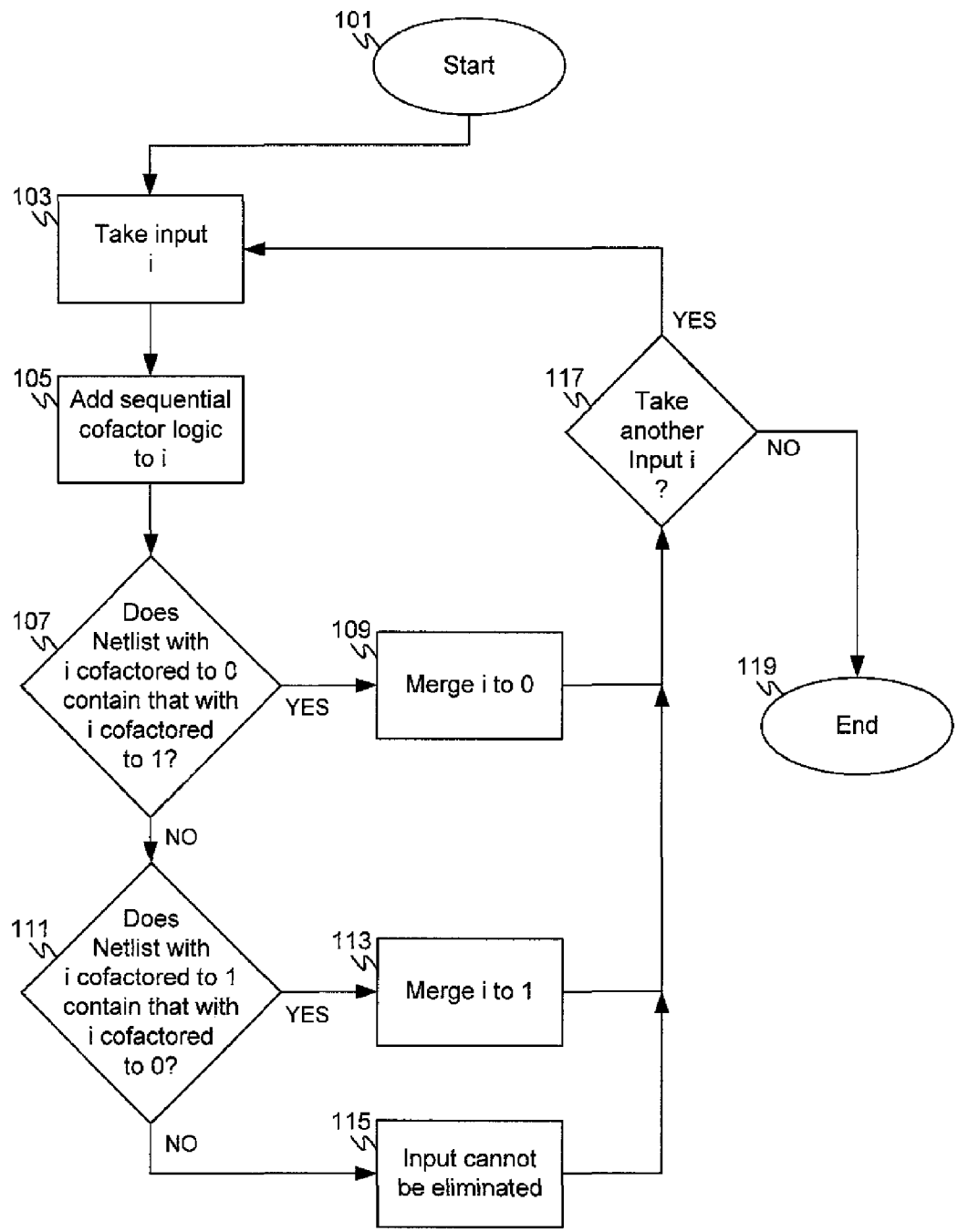
FIG. 1A depicts the flowchart 100 of a method for an overall framework for reducing netlist size through trace-containment based reduction.

FIG. 1A depicts the flowchart 100 of a method for an overall framework for reducing netlist size through trace-containment based reduction. This first aspect of the invention involves iteratively postulating a desired reduction, postulating a temporal relation among inputs of the design to enable effective trace-containment detection, then attempting to prove the corresponding trace-containment to enable the reduction. The top-level loop of this procedure is depicted by the following pseudo-code. The method begins at 101 and proceeds to 103 to take a first input i. In block 105 for each input i sequential cofactor logic is added to the input i. The method proceeds to 107 to determine whether the netlist with i cofactored to 0 trace contains the netlist with i cofactored to 1. As mentioned above, the term cofactor means to replace an input in a design by a constant—either a constant 1 for a positive cofactor or a constant 0 for a negative cofactor. If it is determined in 107 that the netlist with i cofactored to 0 trace contains that with i cofactored to 1 then the method proceeds along the YES branch to 109 to merge i to 0. The method then proceeds from 109 to 117 to determine whether to take another input i. However, back in block 107 if it is determined that the netlist with i cofactored to 0 trace does not contain that with i cofactored to 1 then the method proceeds along the NO branch to 111.

In block 111 the method checks whether the netlist with i cofactored to the 1 trace contains that with i cofactored to 0. If this is found to be true the method proceeds along the YES branch to 113 to merge i to 1. However, if it is determined in block 111 that the netlist with i cofactored to the 1 trace does not contain that with i cofactored to 0 then the method proceeds along the NO path to 115 where it is determined that the input i cannot be eliminated and to remove the sequential cofactor from i. The method then proceeds to 117 to determine whether there is another input i to be considered. If so, the method proceeds along the YES path from 117 back to 103 to take another input i. If it is determined in 117 that there are no further i inputs then the method proceeds from 117 along the NO branch and ends.

At least some embodiments may use the sequential cofactor logic as per methods and systems disclosed in a copending U.S. patent application Ser. No. 12/410,962 (the '962 application) assigned to the same assignee, and entitled "Method, System and Application for Sequential Cofactor-Based Analysis of Netlists." Various embodiments in this copending patent application allow a system to enable the assessment of the impact of an input to a design for one particular timeframe. The method of this copending patent application enables the exploration of an arbitrary sequence of valuations to input i, though assessing the impact of driving 0 vs. 1 on the corresponding input at any arbitrary point in time. The point in time at which the 0 vs. 1 is driven may be referred to as the "cofactor time." Then we may explore whether the negative cofactor trace contains the positive cofactor. If so, we may merge i to 0. If not, we check whether the positive cofactor trace contains the negative. If this is found to be true we may merge 0 to 1. If neither condition is met we may not merge the input to either constant, 0 or 1, and instead proceed in attempting to eliminate the next input.

Figure 1B:
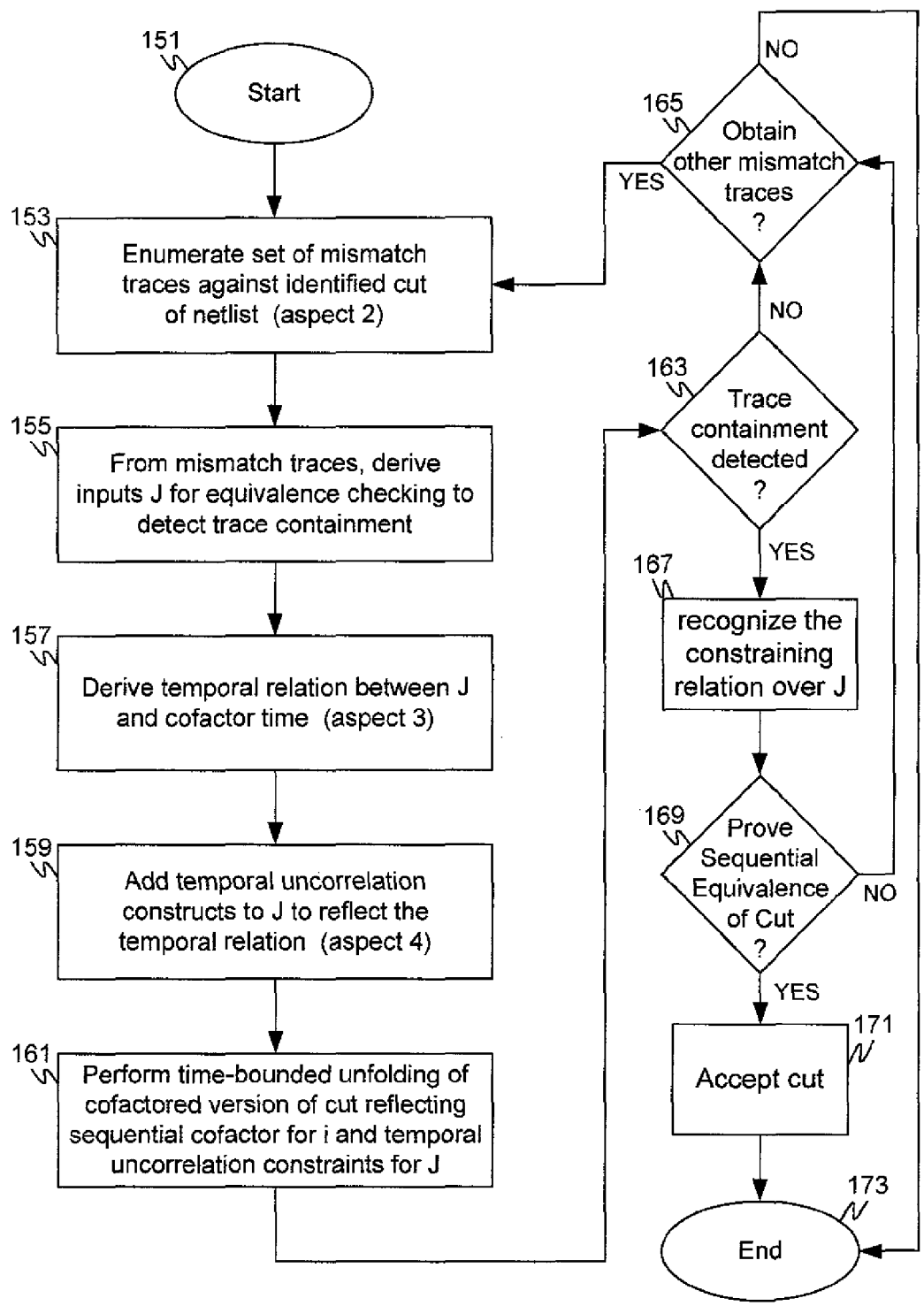
FIG. 1B depicts the flowchart 150 of a method for a high level trace-containment check.

FIG. 1B depicts the flowchart 150 of a method for a high level trace-containment check. The method of FIG. 1B to assess trace-containment begins at 151 and proceeds to 153 to enumerate a set of mismatch traces against the identified cut of the netlist. This may be done with a second aspect of the invention, for example, in the manner discussed below in conjunction with FIG. 2A. The method of FIG. 2A computes a cut of a netlist against which to obtain mismatch traces which may be used to enable efficient trace-containment detection. Returning to block 153 of FIG. 1B, once the mismatch traces are enumerated the method proceeds to 155. In block 155 the mismatch traces are used to derive a set of inputs 'J' to be manipulated to enable equivalence checking to detect trace containment. The method then proceeds to 157 to derive a temporal relation between 'J' and the cofactor time. This may be done using various embodiments of a third aspect of the invention discussed below in conjunction with FIG. 3. Upon completing the temporal relation between 'J' and the cofactor time the method proceeds from 157 to 159.

The activities of block 159 involve adding temporal uncorrelation constraints to 'J' to reflect the temporal relation, a fourth aspect of the invention. The method then proceeds to 161 to perform a time-bounded unfolding of the cofactored versions of the cut, reflecting the sequential cofactor for i and the temporal uncorrelation constraints for 'J'. Upon completing the time-bounded unfolding of the cofactored cut versions in 161 the method proceeds to 163 to determine whether trace-containment can be detected. If trace-containment cannot be verified in 163, for example, due to mismatch traces, the method then proceeds from 163 along the NO path to 165 to assess whether to obtain additional mismatch traces and repeat the process. If it is determined in 165 that other mismatch traces are to be attempted the method proceeds along the YES path from 165 back to 153. Otherwise the method proceeds from 165 along the NO path to 173 and ends.

Back in block 163 if trace-containment is detected on the combinational unfolding result of block 161 the method proceeds from 163 along the YES path to 167 to recognize the constraining relation over 'J.' Upon completing block 167 recognizing the constraining relation over 'J' the method proceeds to block 169 to attempt to prove sequential equivalence of the resulting cut using the constraint relation derived in block 167. In 169 if sequential equivalence of the cut cannot be proved the method proceeds from 169 along the NO path to 165 to assess whether to use the other mismatch traces to repeat the process. However, if the cut is proven to be equivalent in 169 the method proceeds from 169 along the YES path to 171 to accept the cut. The method then proceeds to 173 and ends.

The process of obtaining mismatch traces for the identified cut is described in embodiments of a second aspect of the invention, for example, as discussed below in conjunction with FIG. 2A. Once the cut is obtained, we may identify a set of inputs 'J' which may be manipulated to attempt to enable equivalence checking to detect trace-containment. This process is detailed in embodiments of a third aspect of this invention, for example, as discussed below in conjunction with FIG. 3. Upon completing this process we can inject temporal uncorrelation constraints to 'J' as per embodiments of a fourth aspect of the invention, for example, as discussed below in conjunction with FIG. 4. Then a combinational trace-containment detection algorithm can be used on a temporally unfolded version of the netlist. Unfolding refers to converting a sequential problem into a combinational netlist by unfolding it in time, that is, introducing new inputs for each time step, with a copy of the netlist for time-step i feeds the next-state functions of the registers in time-step 'i+1', and using initial values to replace the registers at time 0.

An example combinational trace-containment detection algorithm is disclosed in the co-pending U.S. patent application Ser. No. 12/425,095 ('095 application) entitled "Method and System for Trace-Containment Detection of Combinational Netlists via Constraint-Based Uncorrelated Equivalence Checking," which is assigned to the current assignee. This copending U.S. patent application discloses a method to detect trace-containment of combinational designs. Various embodiments of the current invention describe a framework for trace-containment based reduction of sequential designs. However, in at least some embodiments of the current invention, we may use aspects of the copending '415 application to efficiently determine a relation over a bounded behavior of the sequential netlist being reduced which may be useful in the sequential domain.

A byproduct of a trace-containment detection algorithm is a relation over the uncorrelated inputs 'J' which represents how one copy of the netlist may be made to behave identically to another. Once we obtain this relation over 'J' for the unfolded netlist, we constrain the corresponding inputs used in the temporally uncorrelated constraints accordingly, and attempt to prove sequential equivalence of the resulting cut. This proof may be obtained through an arbitrary verification algorithm, for example, BDD or SAT-based reachability analysis, induction, interpolation, or the like. A method of sequential equivalence checking is disclosed in U.S. Pat. No. 7,260,799 entitled "Exploiting Suspected Redundancy for Enhanced Design Verification," a patent to the same inventors as the present disclosure, the contents of which are hereby incorporated by reference in their entirety.

Figure 2A:
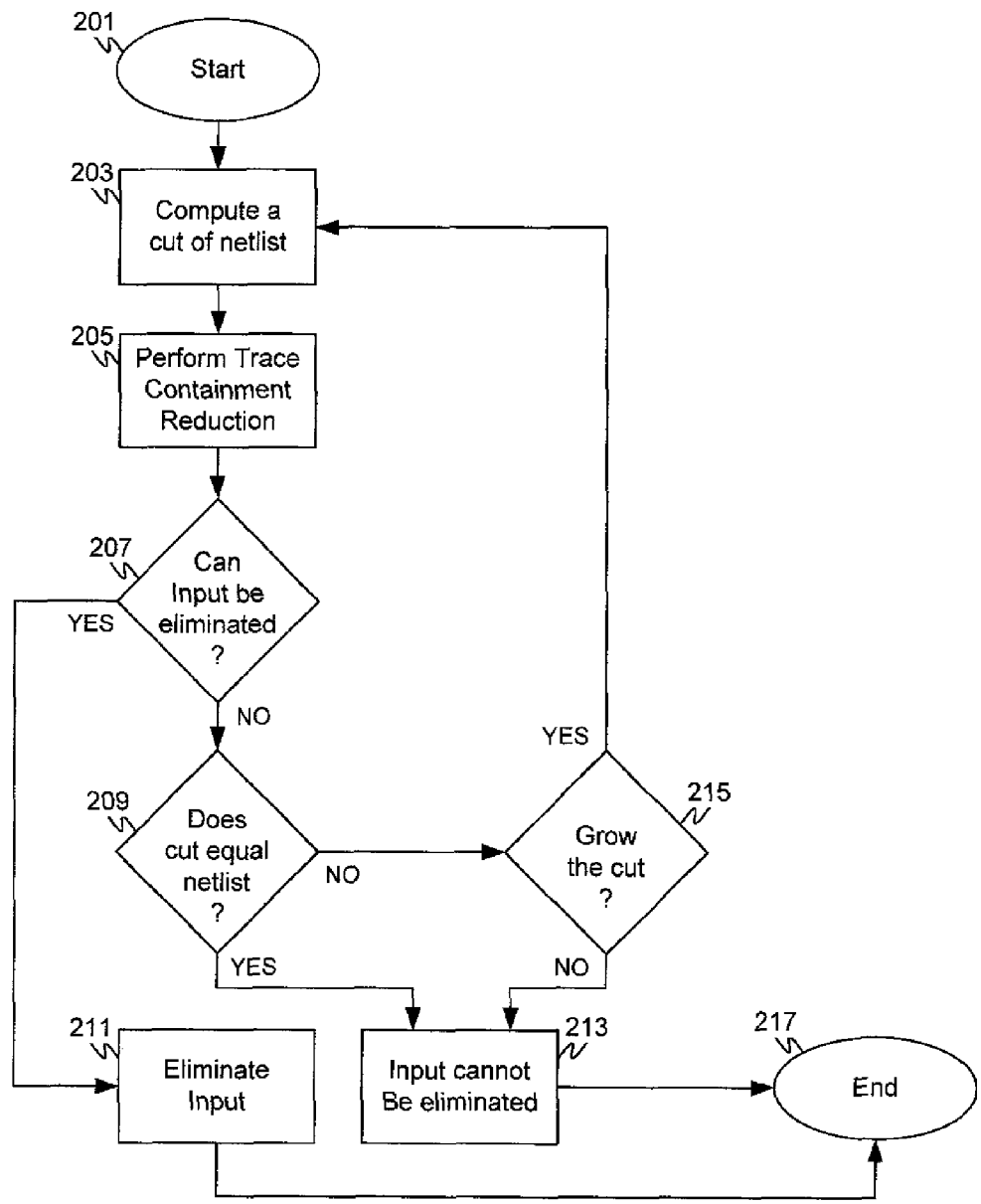
FIG. 2A depicts the flowchart 200 of a method for obtaining a cut for use in trace-containment based reduction using a netlist cut according to various embodiments of the invention.

FIG. 2A depicts the flowchart 200 of a method for obtaining a cut for use in trace-containment based reduction using a netlist cut. Trace-containment detection can be computationally expensive. A method to detect a cut of a netlist against which to obtain mismatch traces which may be used to enable effective trace-containment based reduction. The general philosophy that must be considered when identifying such a cut is that, if the cut is too small, a trace-containment relation is unlikely to exist-whereas if the cut is too large, it may be computationally infeasible to detect trace containment.

Figure 2B:
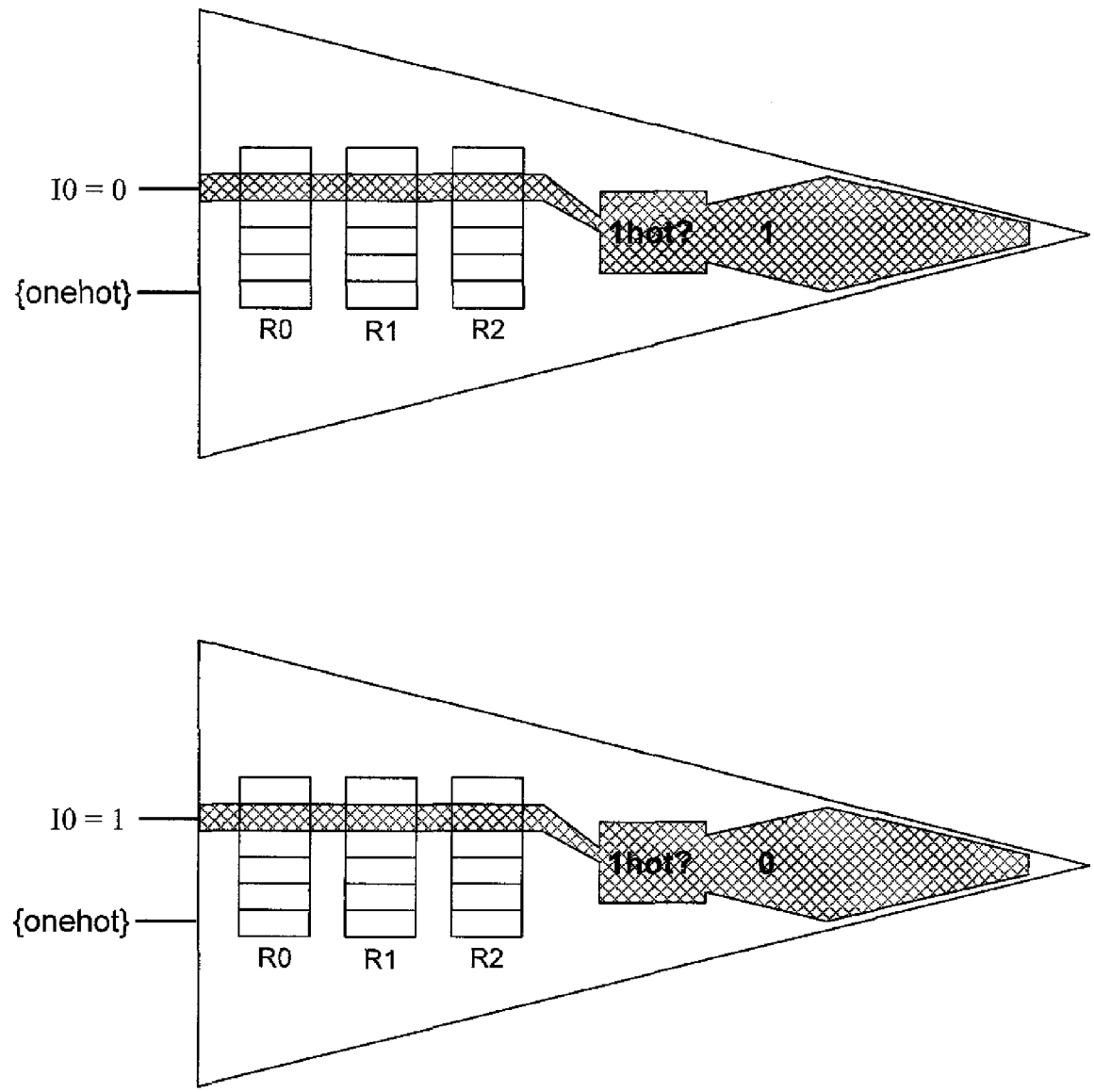
FIG. 2B which depicts exemplary registers in circuitry for which a cut is sought.

To illustrate this problem, consider FIG. 2B which depicts registers in circuitry for which a cut is sought. Assume that the reduction we are attempting is to merge input I0 of the netlist with 0, as depicted at the top of the figure. To validate that this merge preserves verification results, we may wish to compare its behavior against that of the netlist when I0 is driven to 1 as depicted at the bottom of the figure. Assume that the netlist has a vector of inputs aside from I0, which along with I0 are sampled through a set of registers R0, R1, R2 to a one-hot detector labeled "onehot" in the figure. The subset of the netlist, which may evaluate differently across the two netlists, is depicted shaded, and comprises the bits of R0, R1, R2 which sample I0, the onehot detector, and a set of gates in the fanout of the onehot detector.

This facet of the disclosure operates by identifying a cut of the netlist in the fanout of the gate being merged to enable the reduction. This can be done by enumerating a subset of gates which may mismatch across both netlists being analyzed for trace-containment. This is accomplished by analyzing a set of traces and enumerating the gates which differ in behavior across both netlists in any of the traces. This set will form a cut of the netlist since it is impossible that an internal gate of the netlist will differ in behavior without any of the gates in its fanin differing in behavior. In at least one embodiment, the traces are obtained using a hybrid of simulation and bounded exhaustive search, e.g. using a SAT-solver on an unfolded copy of the netlist to explore all behavior producible by the design within a certain number of time-frames after initialization. The latter may be used to directly attempt to identify mismatches across certain gates in the two netlists, and in particular, for gates which have not yet been witnessed as having mismatched across both netlists, yet which have gates in their immediate fanin which have been witnessed as mismatching. This overall process can be summarized with the pseudo-code of FIG. 2C.

Referring to FIG. 2C, the procedure Search_For_Mismatch( ) uses an arbitrary set of verification algorithms such as simulation and SAT-based bounded search as discussed above to try to find a mismatch on the gates of mismatch_frontier. If a trace is found, the procedure Extend_Trace( ) may be used to add behavior and time-frames to that trace to better enable that trace to identify mismatches even on gates beyond mismatch_frontier. The Find_New_Frontier( ) procedure analyzes the resulting trace to find all gates which have been identified as mismatching in "trace", and to create new_mismatch_frontier as the gates directly at the fanout of this region for the next iteration through the loop.

When this procedure terminates successfully, it will have identified a cut of the netlist which partitions gates which have been witnessed to have mismatched vs. those that have not. However, it is generally desirable to select a cut of gates which have been witnessed as the basis of trace-containment detection. Hence, in some embodiments it is desirable to select the gates in the fanin of mismatchfrontier which have been identified as mismatching as our cut. More generally, we may select any cut contained within this maximally-sized mismatching cut as the one to use. Algorithms for min-cut analysis such as that described in the paper entitled "Maximal Flow Through a Network", L. ft Ford and D. P. Fulkerson from Canadian Journal of Mathematics 1956, may be used to identify a smaller cut to attempt to abstract against. In some embodiments resource limitations such as on the maximum length of a mismatch trace, or time or memory limitations on Search_For_Mismatch, or limitations on the size of the mismatch_frontier, may be used to terminate this procedure with a smaller cut.

Generally, the larger the cut the more the resources that may be involved in identifying trace-containment. However, as stated above, a cut too small may not exhibit trace-containment even though it is possible that a deeper cut would. For example, if we choose a cut at R0, or R1, or R2 it may be the case that no trace-containment is possible across the two netlists in FIG. 2B. However, if we choose any cut from the one-hot input or its fanout, trace-containment will be detectable since valuations to other inputs may cause equivalent traces. For optimality, we may wish to obtain a cut as close to one-hot as possible. The procedures discussed in conjunction with FIGS. 2A-C may enable the identification of such a cut.

Several mechanisms are introduced to enhance the scalability of this procedure and thus reduce the computational complexity. One mechanism leverages the ability to perform trace-containment analysis on a cut of the netlist vs. the entire netlist. A flowchart for obtaining and testing such a cut in accordance with embodiments of a second aspect of this invention is depicted in FIG. 2A. The cut (or cuts) may be determined and tested for each input i to which sequential cofactor logic has been added, for example, as per blocks 103 and 105 of FIG. 1.

Returning to FIG. 2A, the method of this figure begins at 201 and proceeds to 203 to compute a cut of the netlist against which to detect trace-containment. The method then proceeds to block 205 to perform trace containment reduction. This may be done in the manner described above in conjunction with blocks 107-115 of FIG. 1. The method then proceeds to 207 to determine whether the input can be eliminated. If the input cannot be eliminated the method proceeds from 207 via the NO branch to 209 where it is determined whether the cut equals the netlist. However, if it is determined in 207 that the input can be eliminated the method proceeds from 207 along the YES branch to 211 to eliminate the input. Upon eliminating the input in 211 the method proceeds to 217 and ends.

Returning to block 209 if it is determined that the cut equals the netlist the method proceeds along the YES path to 213, since the input cannot be eliminated, and then on to 217 where the method ends. However, if it is determined in 209 that the cut does not equal the netlist the method proceeds along the NO path to 215. In block 215 it is determined whether or not to grow the cut. In some instances it may not be possible to grow the cut, while in other instance it may be possible but not feasible (or practical). For example, making the cut larger may entail processing resources greater than a predetermined maximum limit. In such cases, although it would be possible to grow the cut it may be prohibitively expensive. If it is decided in 215 to grow the cut the method proceeds from 215 along the YES path back to 203 to determine a new cut. However, if it is determined that the cut shall not be grown (e.g., either because it is impossible or undesirable based on predefined criteria such as estimated processing requirements), then the method proceeds from 215 to 213 to specify the input as one that cannot be eliminated. In this case the sequential cofactor is removed from i and then the method then proceeds to block 217 where it ends.

Figure 3:
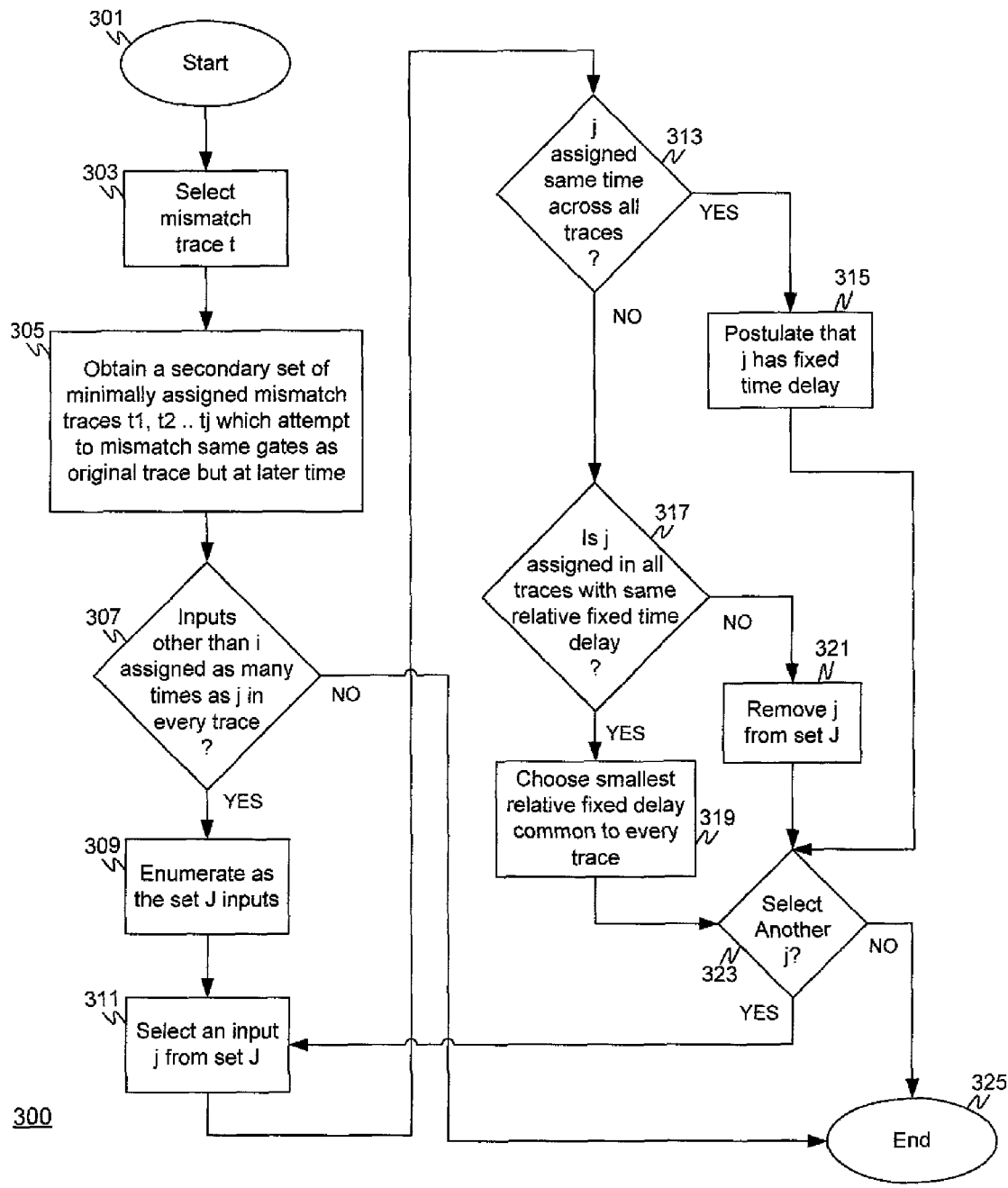
FIG. 3 depicts the flowchart 300 of a method for determining a temporal relation between inputs according to various embodiments of the invention.

FIG. 3 involve methods of determining a temporal relation between inputs, coupled with a mechanism to cast a sequential trace-containment problem as a combinational trace-containment problem, that may be used to enable effective trace-containment based reduction according to various embodiments of the invention.

As disclosed in the copending '415 patent application to the same assignee entitled "Method and System for Trace-Containment Detection of Combinational Netlists via Constraint-Based Uncorrelated Equivalence Checking" trace-equivalence detection may be enabled for combinational netlists by uncorrelating certain inputs and manipulating them using constraints in a way that enables equivalence checking to capture trace-containment detection. For sequential netlists, this manipulation process becomes substantially more intricate since various inputs may impact the cut being used for trace-containment detection, as per the embodiments discussed above in conjunction with FIGS. 2A-C, with a different relative time-frames. For example, assume that a netlist has an "opcode" input vector, as well as a "valid" input which, when asserted to 1, will cause the design to sample and decode the "opcode" one time-step later. Assume that we wish to merge "valid" to 1 since doing so will preserve trace-equivalence, that is, the decoder output will drive "no_op=1" one time-step after "valid=0" as well as any time that "opcode={no-op}". In this example, to enable trace-containment detection, we need to be able to uncorrelate "opcode" and to constrain it to evaluate to {no-op} one time-step after "valid=1" to produce the same behavior as when "valid=0".

Relative fixed delay and fixed time are two types of temporal relations supported by various embodiments disclosed herein. Relative fixed delay may be understood from the opcode example discussed above in the preceding paragraph. In that example the uncorrelated inputs ("opcode") require a relative fixed delay of 1 relative to the input being merged ("valid"). This delay may be in the positive or negative direction, or even concurrent. Our invention handles only concurrent or positive delays. The other type of temporal relation, fixed time, may be understood from the following example. Assume that there is a data-routing netlist, and we wish to verify that it correctly routes data. The netlist may have a "data_in" input vector, and a "data_out" output vector. The property we wish to check is that a particular value will appear at "data_out" if and only if that same value has appeared earlier at "data_in". One way to implement this check is to create a random constant, implemented with a set of registers which randomly initialize and thereafter holds their value. We may then set a register arbitrarily called "seen" when "data_in" matches the random constant, and utilize a target which asserts if "data_out" equals the random constant yet "seen=0". If we wish to tie one bit of "data_in" to a constant, say 0, note that the result of the equivalence check against the random constant will not be equivalent to the case where that bit of "data n" is 1. In particular, consider the case where the random constant has value "111111" and "data_in" of the two trace-containment checked netlists is "111111" vs "011111". In the former case, the equivalence check will report equivalence. In the latter case, the equivalence check will report inequivalence (or nonequivalence). To enable trace-containment detection, we uncorrelate the same bit of the random constant (as is tied for "data_in"). Furthermore, the uncorrelated bit of the random constant must be constrained at time 0, regardless of the time at which "data_in" differs.

Our base mechanism in attempting to learn a temporal relation between inputs relies upon the analysis of mismatch traces, e.g., those mismatch traces obtained during the second aspect described above in conjunction with FIGS. 2A-C. In at least one embodiment we wish to obtain minimally-assigned traces, that is, traces which include as few input assignments as possible to illustrate the desired mismatch. Minimal-assignment traces may be produced by using a circuit-SAT solver to analyze the behavior of the two designs when searching for a mismatch because circuit-SAT solvers do not assign values to unnecessary inputs. Alternatively, a post-processing mechanism may be employed which eliminates unnecessary input assignments, e.g., by checking whether the mismatch trace still illustrates a mismatch if the valuation at a given input is inverted and if so, to eliminate that input assignment. Any mismatch trace by necessity will include time-frames at least as deep as the cofactor time. Once we have a set of minimally-assigned mismatch traces, we may proceed to identify a set of inputs 'J' which are candidates for manipulating to enable equivalence checking to detect trace-containment, as a sequential extension of the copending U.S. patent application to the same assignee entitled "Method and System for Trace-Containment Detection in Combinational Netlists via Constraint-Based Uncorrelated Equivalence Checking". We may also proceed to identifying temporal relations between those inputs and the cofactor time.

Returning to FIG. 3, this figure depicts the flowchart 300 of a method for determining a temporal relation between inputs for use in enabling effective trace-containment based reduction according to various embodiments of the invention. The method starts at 301 and proceeds to 303 to select a mismatch trace t to be analyzed. The method then proceeds to 305 to obtain a secondary set of minimally-assigned mismatch traces t1, t2 ... tj which attempts to mismatch the same set of gates but at later time-frames than witnessed in the original trace. There may be several user-specifiable parameters for the selection of mismatch traces. For example, one user-specifiable parameter may be how many distinct secondary traces to search for, and another may be for how many time-frames after the original mismatch trace we search for a new mismatch. In at least one embodiment we may force the cofactor time of each secondary trace to the cofactor time of 't' plus the number of additional time-frames to be added to the mismatch depth. We may use an arbitrary mechanism to search for such traces, for example, using a SAT solver on an unfolded instance as per the first aspect discussed above in conjunction with FIG. 1. We additionally wish to obtain minimally-assigned traces.

Once the secondary set of minimally-assigned mismatch traces t1, t2 . . . tj is obtained in 305 the method proceeds to 307 to determine whether inputs other than i are assigned as many times as 'j' in every trace. That is, block 307 determines inputs other than i which are assigned as many times as i is assigned in every resulting trace, or optionally which are assigned whatsoever. If block 307 does not result in any such inputs the method proceeds from 307 along the NO path to 325 and ends. If it is determined in 307 that there are any such inputs the method then proceeds from 307 along the YES path to 309 to enumerate the discovered inputs as the set 'J'. Once the set 'J' is defined in 309 the method proceeds to 311 to select an input 'j' from set 'J.'

In 313 it is determined whether 'j' is assigned at the same time across all traces. If it turns out to be the case that 'j' is assigned at the same time across all traces the method proceeds from 313 along the YES path to 315 to postulate that this 'j' input has a fixed time delay, and then on from 315 to 323 to determine whether another 'j' is to be selected. In evaluating 'j' in block 313, some implementations may optionally look only at a specific set of time-frame or even a single particular specific time frame. It has been found that checking for inputs that are assigned only at time 0 captures most of the utility of fixed time delay inputs. Back in block 313, if 'j' is found to have different time values across the traces then the method proceeds from 313 along the NO path to 317.

In 317 the input 'j' is evaluated to determine whether 'j' in every trace is assigned with the same relative fixed delay with respect to the cofactor time of each corresponding trace. If 'j' is found to have different fixed time delays then the method proceeds to 321 to remove the 'j' input from the set 'J.' Once 'j' has been removed the method proceeds to 323 to determine whether or not to select another 'j' for the process. Back in 317 if 'j' is found in every trace to be assigned with the same relative fixed delay with respect to the cofactor time of each corresponding trace, then the method proceeds from 317 along the YES branch to 319. In 319 the smallest relative fixed delay which holds in every trace is chosen as the relative fixed delay for the 'j' input. When completed and all input values of 'j' have been saved, this process will yield a candidate set of inputs 'J' to be manipulated, as well as a guess as to the temporal relation to use between 'J' and the cofactor time. The method then proceeds to 323 where it is determined whether or not to select another 'j' for the process. If another input 'j' from the set 'J' is to be considered the method proceeds from 323 along the YES path back to block 311. Otherwise the method proceeds from 323 along the NO path to 325 where the method ends.

Figure 4A:
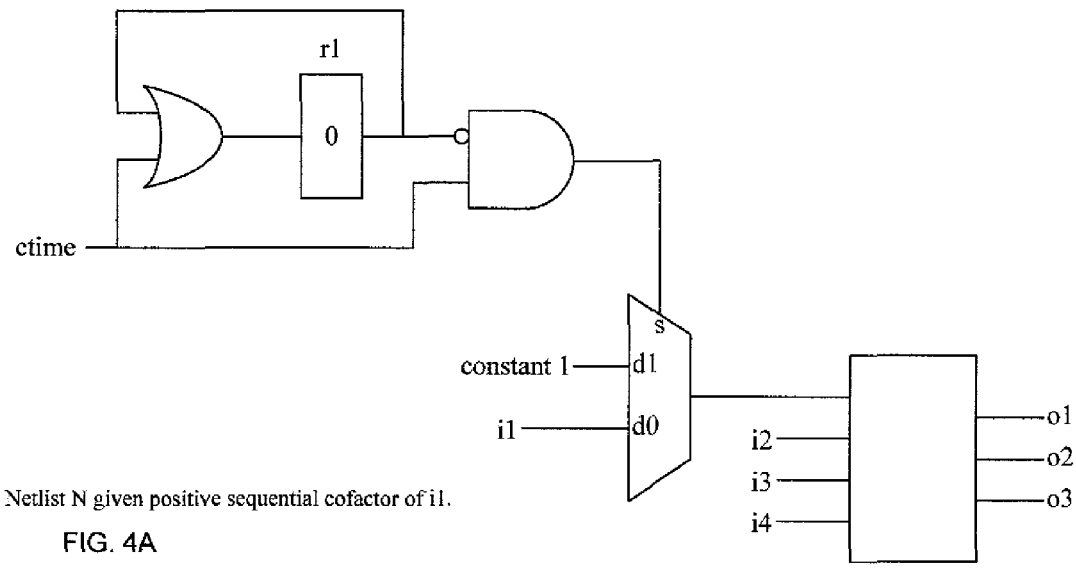
FIGS. 4A-D depict logic for implementing the determined temporal relation between an input sought to be eliminated and other inputs.

A fourth aspect of various embodiments of the invention pertains to a mechanism to implement the determined temporal relation between the input that is sought to be eliminated and other inputs. This enables efficient trace-equivalence detection. As per the disclosure of the copending U.S. patent application entitled "Method, System and Application for Sequential Cofactor-Based Analysis of Netlists," the sequential cofactor may be implemented in a preferred embodiment by injecting a multiplexor onto the input i to be cofactored. The multiplexor will select between a common input across both netlists being equivalence or trace-containment checked, versus for one arbitrary time-frame a different constant across both netlists. A signal "ctime" is created which is asserted for the first time during the selection of the differing constant. This time is referred to herein as the "cofactor time." An embodiment of this logic is depicted in FIG. 4A for the netlist N given a positive sequential cofactor of i1.

Figure 4B:
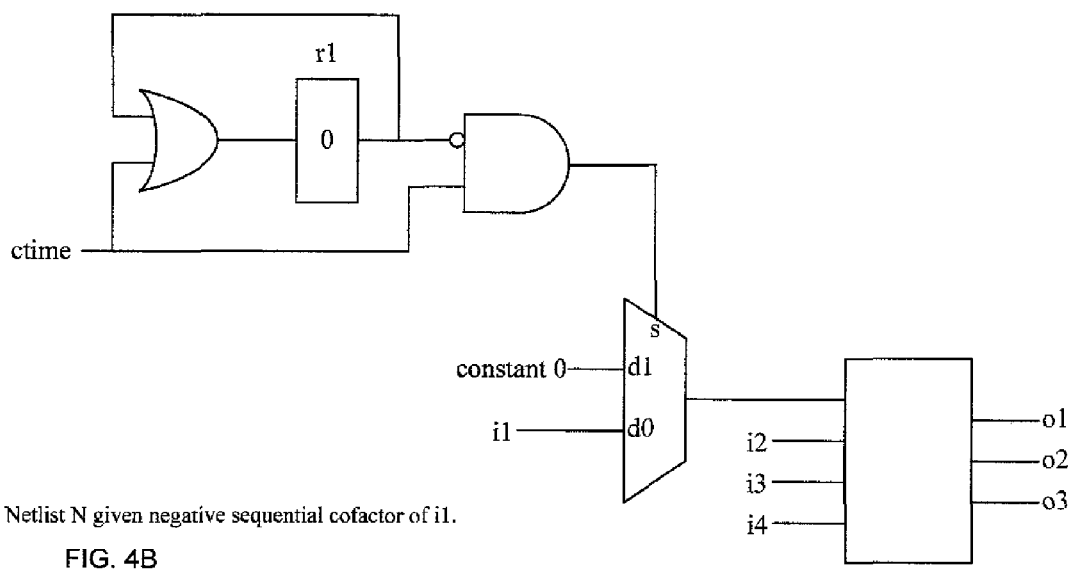
Figure 4C:
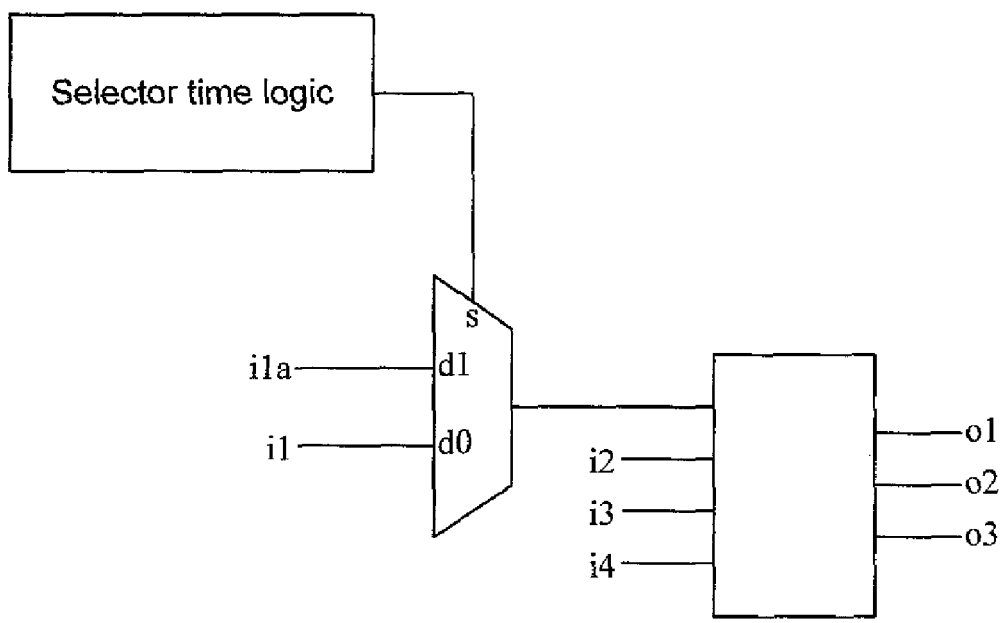
Figure 4D:
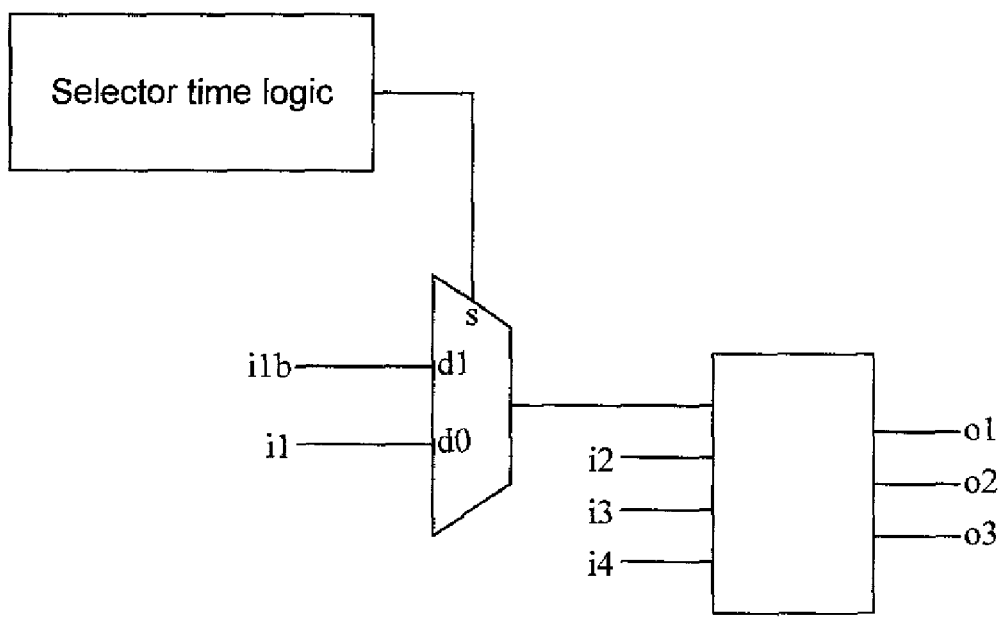

Similar to the sequential cofactor netlist, the apparatus used to temporally uncorrelate an input consists of a multiplexor which selects a common input across both netlists being trace-containment checked for all but one time-frame, though instead of selecting a differing constant for that specific time-frame, it selects a differing unique input. Thus, for one particular time-step, a distinct input will be driven across each of the two netlists. For other time-steps, a common input will be driven. The logic used to select the multiplexor, that is, to determine the time-frame when the different input values will be driven through the multiplexor, will be discussed below. This logic is depicted in FIG. 4B for the netlist N given a positive sequential cofactor of i1.

The selector time logic differs depending on the type of temporal relation between the uncorrelated inputs and the input being cofactored. We consider both cases, the case of fixed time delays and also relative fixed delays. Fixed time delays may be implemented by identifying the maximum fixed time k across all inputs to be uncorrelated, i.e., across all inputs within 'J' which aspect 3 of this invention determined were of type "fixed time delay." Constructing an unconditional up-counter which initializes to 0 and saturates at the value 'k+1'. Using a comparison between the count value and the fixed time delay for the corresponding uncorrelated input as "selector time logic." Note that this counter itself may be reused across all fixed time delay inputs.

Relative fixed delays represent cases where the uncorrelated inputs should be allowed to mismatch at one timeframe a specific number of time-steps after the cofactor time. Such logic may be implemented by identifying the maximum relative fixed delay 'k' across all inputs to be uncorrelated (i.e., across all inputs within 'S' which the third aspect of this invention disclosed in conjunction with FIG. 3 determined were of type "relative time delay"), and adding a k_stage pipeline onto the multiplexor selector from the sequential cofactor circuit. This pipeline is created by adding k registers to the netlist which initialize to 0. The first register has the multiplexor selector as its next-state function. The second register has the first register as its next-state function, and the third register has the second register as its next-state function, etc. Given an uncorrelated input with relative fixed delay 'J,' we may use the 'j'-th pipeline register as the "selector time logic" for that input, where 'j=0' entails using the multiplexor selector itself from the sequential cofactor circuit.

We additionally note that, during combinational trace equivalence detection, a relation is formed across the uncorrelated inputs which enables equivalence checking under a constraint implementing the relation to detect trace containment. In our sequential netlist reduction framework we form this relation over the inputs which differ across netlists in the temporal uncorrelation logic. Since these inputs only impact the behavior of the design at one time-frame, we may directly lift the constraint relation from the unfolded combinational netlist to the sequential netlist.

Various activities may be included or excluded as described for the methods and processes above, or performed in a different order, with the rest of the activities still remaining within the scope of at least one exemplary embodiment. For example, in some embodiments block 111 of FIG. 1 may be performed before block 107. Many other such instances of steps being performed in an order other than that shown in the figures would be known by those of ordinary skill in the art.

Figure 5:
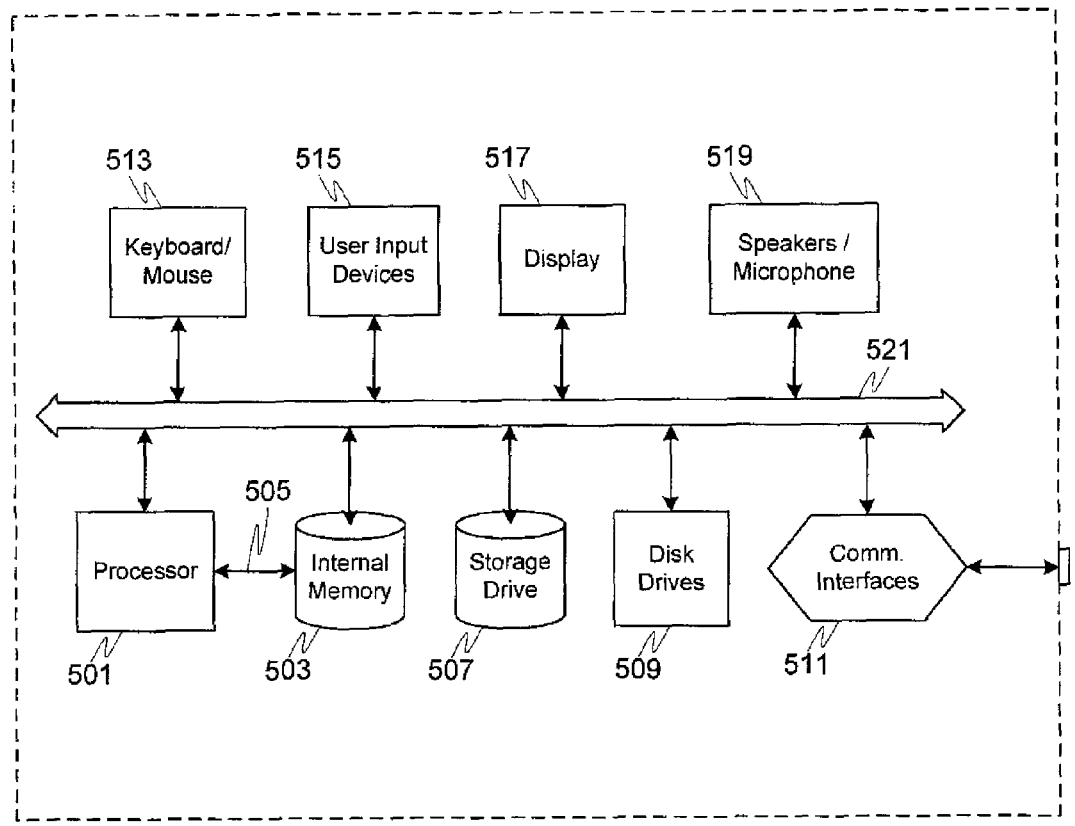
FIG. 5 depicts a computer system 500 suitable for implementing and practicing various exemplary embodiments.

FIG. 5 depicts an exemplary computer system 500 suitable for implementing and practicing various exemplary embodiments. The computer system 500 may be configured in the form of a desktop computer, a laptop computer, a mainframe computer, or any other arrangements capable of being programmed or configured to carry out instructions. The computer system 500 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 500 includes a processor 501 which may be embodied as a microprocessor or central processing unit (CPU). The processor 501 is typically configured to access an internal memory 503 via a bus such as the system bus 521. The internal memory 503 may include one or more of random access memory (RAM), read-only memory (ROM), cache memory, or a combination of these or other like types of circuitry configured to store information in a retrievable format. In some implementations the internal memory 503 may be configured as part of the processor 501, or alternatively, may be configured separate from it but within the same packaging. The processor 511 may be able to access internal memory 503 via a different bus or control lines (e.g., local bus 505) than is used to access the other components of computer system 500.

The computer system 500 also typically includes, or has access to, one or more storage drives 507 (or other types of storage memory) and floppy disk drives 509. Storage drives 507 and the floppy disks for floppy disk drives 509 are examples of machine readable mediums suitable for storing the final or interim results of the various embodiments. The storage drive 507 is often a hard disk drive configured for the storage and retrieval of data, computer programs or other information. The storage drive 507 need not necessary be contained within the computer system 500. For example, in some embodiments the storage drive 507 may be server storage space within a network or the Internet that is accessible to the computer system 500 for the storage and retrieval of data, computer programs or other information. For example, the computer system 500 may use storage space at a server storage farm accessible by the Internet 550 or other communications lines. The floppy disk drives 509 may include a combination of several disc drives of various formats that can read and/or write to removable storage media (e.g., CD-R, CD-RW, DVD, DVD-R, floppy disk, etc.). The computer system 500 may either include the storage drives 507 and floppy disk drives 509 as part of its architecture (e.g., within the same cabinet or enclosure and/or using the same power supply), as connected peripherals, or may access the storage drives 507 and floppy disk drives 509 over a network, or a combination of these. The storage drive 507 is often used to store the software, instructions and programs executed by the computer system 500, including for example, all or parts of the computer application program for project management task prioritization.

The computer system 500 may include communication interfaces 511 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 500 may be connected to the Internet via the wireless router 501 (or a wired router or other node—not show) rather than have a direct connected to the Internet. The components of computer system 500 may be interconnected by a bus 521 and/or may include expansion slots conforming to any of various industry standards such as PCI (Peripheral Component Interconnect), ISA (Industry Standard Architecture), or EISA (enhanced ISA).

Typically, the computer system 500 includes one or more user input/output devices such as a keyboard and/or mouse 513, or other means of controlling the cursor (e.g., touchscreen, touchpad, joystick, trackball, etc.) represented by the user input devices 515. The communication interfaces 511, keyboard and mouse 513 and user input devices 515 may be used in various combinations, or separately, as means for receiving information and other inputs to be used in carrying out various programs and calculations. A display 517 is also generally included as part of the computer system 500. The display may be any of several types of displays, including a liquid crystal display (LCD), a cathode ray tube (CRT) monitor, a thin film transistor (TFT) array, or other type of display suitable for displaying information for the user. The display 517 may include one or more light emitting diode (LED) indicator lights, or other such display devices. In addition, most computer systems 500 also include, or are connected to, one or more speakers and microphones 519 for audio output and input. Speech recognition software may be used in conjunction with the microphones 519 to receive and interpret user speech commands.

The invention may be implemented with any sort of processing units, processors and controllers capable of performing the stated functions and activities. For example, the processor 501 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 503, the storage drive 507, or other type of machine-readable medium, including for example, floppy disks, optical disks, a hard disk, CD, flash memory, ram, or other type of machine readable medium as recognized by those of ordinary skill in the art. The computer system 500 is configured to receive the design or other netlist information for the integrated circuit (IC) or other circuitry or to be analyzed and store the information in a computer-readable medium such as the internal memory 503, the storage drive 507, or other type of machine-readable medium. The computer system 500 is configured to modify the design by loading and executing instructions that operate on the netlist information. Upon completing modifications to the design the computer system 500 is configured to provide the modified design information, e.g., by storing it on a computer readable medium, in a format suitable for fabricating the IC design.

The invention may be implemented with any sort of processing units, processors and controllers (e.g., processor 501 of FIG. 5) capable of performing the stated functions and activities. For example, the processor 501 may be embodied as a microprocessor, microcontroller, DSP, RISC processor, or any other type of processor that one of ordinary skill would recognize as being capable of performing the functions described herein. A processing unit in accordance with at least one exemplary embodiment can operate computer software programs stored (embodied) on computer-readable medium such as the memory 503, storage drives 507, disk drives 509, or other like type of storage devices such as a CD, flash memory, ram, or other computer readable medium as recognized by one of ordinary skill in the art. The computer software programs can aid or perform the steps and activities described above. For example computer programs in accordance with at least one exemplary embodiment may include: source code for identifying a cut of the netlist, source code for enumerating a set of mismatch traces, source code for derive a set of inputs 'J' from the mismatch traces for equivalence checking to detect trace containment, source code for performing time-bounded unfolding of a cofactored version of the cut reflecting sequential cofactor for i and temporal uncorrelation constraints for the set of inputs "J," source code for determining whether there is trace containment, source code for recognizing a constraining relation over the set of inputs 'J' in response to detecting trace containment, and source code for seeking to prove sequential equivalence of the cut. There are many further source codes that may be written to perform the stated steps and procedures above, and these are intended to lie within the scope of exemplary embodiments.

State holding elements, or state elements, are discussed above in terms of being implemented as registers or gates. However, in some embodiments any sort of state holding element may be used to implement various embodiments, including for example, registers, latches, state machines, or the like. For the purposes of illustrating and explaining the invention the terms variable, gate and register have been used interchangeably throughout this disclosure.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of identifying trace-containment for a sequential circuitry design netlist by execution of instructions loaded into a computer system, the method comprising:
   identifying, by the execution of said instructions loaded into the computer system, a cut of the netlist comprising an input i;
   enumerating, by the execution of said instructions, a set of mismatch traces;
   deriving, by the execution of said instructions, a set of inputs 'J' from the mismatch traces for equivalence checking to detect trace containment;
   performing, by the execution of said instructions, time-bounded unfolding of a cofactored version of the cut reflecting sequential cofactor for the input i and temporal uncorrelation constraints for the set of inputs 'J';
   determining, by the execution of said instructions, whether there is trace containment;
   in response to detecting trace containment, recognizing a constraining relation over the set of inputs 'J'; and
   seeking, by the execution of said instructions, to prove sequential equivalence of said cut subject to the constraining relation.

2. The method of claim 1, further comprising:
   in response to proving the sequential equivalence of the cut, reducing, by the execution of said instructions, said sequential circuitry design netlist by merging said input to a constant.

3. The method of claim 1, further comprising:
   as part of the identifying of said cut, determining, by the execution of said instructions, whether the cut equals the netlist; and
   in response to determining that the cut does not equal the netlist, deciding, by the execution of said instructions, whether to grow the cut.

4. The method of claim 1, wherein the set of mismatch traces is enumerated against the identified cut of the netlist.

5. The method of claim 1, further comprising:
   deriving, by the execution of said instructions, a temporal relation between said set of inputs 'J' and a cofactor time for the input i; and
   adding, by the execution of said instructions, temporal uncorrelation constraints to said inputs 'J' to reflect the temporal relation.

6. The method of claim 5, wherein said deriving the temporal relation between said set of inputs 'J' and the cofactor time further comprises:
   obtaining, by the execution of said instructions, a secondary set of minimally assigned mismatch traces which attempt to mismatch same gates as said set of mismatch traces but at later time; and
   removing, by the execution of said instructions, an input 'j' from the set of minimally assigned mismatch traces.

7. The method of claim 6, further comprising:
   determining, by the execution of said instructions, whether the input 'j' is assigned a same time across all traces in the set of minimally assigned mismatch traces 'J', or whether the input 'j' is assigned a same relative time in all of said traces;
   in response to detecting the input 'j' to have the same time across all of said traces, deriving, by the execution of said instructions, the temporal relation by postulating that 'j' has a fixed time delay;
   in response to detecting the input 'j' to be assigned to the same relative time in all of said traces, deriving, by the execution of said instructions, the temporal relation by postulating that 'j' has a relative fixed delay; and
   in response to detecting the input 'j' to have a different time in at least one of said traces and in response to detecting the input 'j' to have a different relative time in at least one of said traces, removing, by the execution of said instructions, the input 'j' from the set of minimally assigned mismatch traces 'J'.

8. A software product comprising a non-transitory machine readable medium including a program of instructions for identifying trace-containment for a sequential circuitry design netlist by execution of instructions, wherein the program of instructions upon being executed on a computer causes the computer to perform activities comprising:
   identify, by the execution of said instructions, a cut of the netlist comprising an input i;
   enumerate, by the execution of said instructions, a set of mismatch traces;
   derive, by the execution of said instructions, a set of inputs 'J' from the mismatch traces for equivalence checking to detect trace containment;
   perform, by the execution of said instructions, time-bounded unfolding of a cofactored version of the cut reflecting sequential cofactor for the input i and temporal uncorrelation constraints for the set of inputs 'J';
   determine, by the execution of said instructions, whether there is trace containment;
   in response to detecting trace containment, recognize, by the execution of said instructions, a constraining relation over the set of inputs 'J'; and seek, by the execution of said instructions, to prove sequential equivalence of said cut subject to the constraining relation.

9. The software product of claim 8, further comprising:
in response to proving the sequential equivalence of the cut, reduce, by the execution of said instructions, said sequential circuitry design netlist by merging said input i to a constant.

10. The software product of claim 8, further comprising:
as part of the identifying of said cut, determine, by the execution of said instructions, whether the cut equals the netlist; and
in response to determining that the cut does not equal the netlist, decide, by the execution of said instructions, whether to grow the cut.

11. The software product of claim 8, wherein the set of mismatch traces is enumerated against the identified cut of the netlist.

12. The software product of claim 8, further comprising:
derive, by the execution of said instructions, a temporal relation between said set of inputs 'J' and a cofactor time for the input i; and
add, by the execution of said instructions, temporal uncorrelation constraints to said inputs 'J' to reflect the temporal relation.

13. The software product of claim 12, wherein said deriving the temporal relation between said set of inputs 'J' and the cofactor time further comprises:
obtain, by the execution of said instructions, a secondary set of minimally assigned mismatch traces which attempt to mismatch same gates as said set of mismatch traces but at later time; and
remove, by the execution of said instructions, an input 'j', from the set of minimally assigned mismatch traces.

14. The software product of claim 13, further comprising:
determine, by the execution of said instructions, whether the input 'j' is assigned a same time across all traces in the set of minimally assigned mismatch traces 'J', or whether the input 'j' is assigned a same relative time in all of said traces;
in response to detecting the input 'j' to have the same time across all of said traces, derive, by the execution of said instructions, the temporal relation by postulating that 'j' has a fixed time delay;
in response to detecting the input 'j' to be assigned to the same relative time in all of said traces, derive, by the execution of said instructions, the temporal relation by postulating that 'j' has a relative fixed delay; and
in response to detecting the input 'j' to have a different time in at least one of said traces and in response to detecting the input 'j' to have a different relative time in at least one of said traces, remove, by the execution of said instructions, the input 'j' from the set of minimally assigned mismatch traces 'J'.

15. A computer system configured for identifying trace-containment for a sequential circuitry design netlist, the system comprising:
input means for receiving the circuitry design netlist, a cut of the netlist being identified that comprises an input i;
memory configured to store an enumerated set of mismatch traces;
means for deriving a set of inputs 'J' from the mismatch traces for equivalence checking to detect trace containment;
a processor suitably disposed to execute instructions for performing time-bounded unfolding of a cofactored version of the cut reflecting sequential cofactor for the input i and temporal uncorrelation constraints for the set of inputs 'J';
means for determining whether there is trace containment, and in response to detecting trace containment, recognizing a constraining relation over the set of inputs 'J'; and
wherein said processor is suitably disposed to execute instructions for seeking to prove sequential equivalence of said cut subject to the constraining relation.

16. The computer system of claim 15, further comprising:
wherein, in response to proving the sequential equivalence of the cut, said processor is suitably disposed to execute instructions for reducing said sequential circuitry design netlist by merging said input i to a constant.

* * * * *